United States Patent
Li et al.

(10) Patent No.: US 11,538,839 B2
(45) Date of Patent: Dec. 27, 2022

(54) SOLID-STATE IMAGE SENSOR INCLUDING PATTERNED STRUCTURE FOR DECREASING PETAL FLARES

(71) Applicant: VisEra Technologies Company Limited, Hsin-Chu (TW)

(72) Inventors: Ching-Hua Li, Taoyuan (TW); Yu-Chi Chang, Hsinchu County (TW); Zong-Ru Tu, Zhubei (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 106 days.

(21) Appl. No.: 17/094,531

(22) Filed: Nov. 10, 2020

(65) Prior Publication Data

US 2022/0149096 A1 May 12, 2022

(51) Int. Cl.
*H01L 27/146* (2006.01)
*H04N 5/335* (2011.01)

(52) U.S. Cl.
CPC .... *H01L 27/14621* (2013.01); *H01L 27/1461* (2013.01); *H01L 27/14605* (2013.01); *H04N 5/335* (2013.01); *H01L 27/14627* (2013.01)

(58) Field of Classification Search
CPC ......... H01L 27/14621; H01L 27/14605; H01L 27/1461; H01L 27/14627; H04N 5/335
See application file for complete search history.

(56) References Cited

U.S. PATENT DOCUMENTS

| | | | |
|---|---|---|---|
| 2017/0201726 A1* | 7/2017 | Yorikado | H04N 5/378 |
| 2019/0267420 A1* | 8/2019 | Lee | H04N 5/37455 |
| 2019/0319060 A1* | 10/2019 | Do | H04N 5/232122 |
| 2020/0258929 A1* | 8/2020 | Imoto | G02B 5/20 |

FOREIGN PATENT DOCUMENTS

| | | |
|---|---|---|
| JP | 2010245129 A | 10/2010 |
| JP | 2014225667 A | 12/2014 |
| JP | 2019186516 A | 10/2019 |
| TW | 202038477 A | 10/2020 |

\* cited by examiner

*Primary Examiner* — Gevell V Selby
(74) *Attorney, Agent, or Firm* — Muncy, Geissler, Olds & Lowe, P.C.

(57) ABSTRACT

A solid-state image sensor is provided. The solid-state image sensor includes a plurality of photoelectric conversion elements. The solid-state image sensor also includes a color filter layer disposed above the photoelectric conversion elements. The color filter layer has a plurality of color filter segments. The solid-state image sensor further includes a partition grid disposed between the color filter segments. Moreover, the solid-state image sensor includes a patterned structure disposed on the color filter layer. The patterned structure has a plurality of patterned segments. The solid-state image sensor also includes a transparent layer disposed on the color filter layer and the partition grid. The transparent layer surrounds the patterned segments. At least one patterned segment is disposed on the partition grid.

19 Claims, 15 Drawing Sheets

SOLID-STATE IMAGE SENSOR INCLUDING PATTERNED STRUCTURE FOR DECREASING PETAL FLARES

BACKGROUND

Technical Field

The embodiments of the present disclosure relate to image sensors, and in particular they relate to solid-state image sensors that may decrease petal flares.

Description of the Related Art

Solid-state image sensors (e.g., charge-coupled device (CCD) image sensors, complementary metal-oxide semiconductor (CMOS) image sensors, and so on) have been widely used in various image-capturing apparatuses such as digital still-image cameras, digital video cameras, and the like. The light-sensing portion in the solid-state image sensor may be formed at each of pixels, and signal electric Charges may be generated according to the amount of light received in the light-sensing portion. In addition, the signal electric charges generated in the light-sensing portion may be transmitted and amplified, whereby an image signal is obtained.

In solid-state image sensors, the partition grid may be used to separate different color filter layers. However, it is easy to have grating diffraction issues owing to the same partition grid periods, which may cause the obtained image to have color dispersion (petal flares) and ghost images. Therefore, there are still various challenges in the design and manufacturing of solid-state image sensors.

BRIEF SUMMARY

In some embodiments of the present disclosure, the solid-state image sensor includes a patterned structure that has a plurality of patterned segments, which may prevent the partition grids from generating diffraction, thereby improving the quality of the image signal from the photoelectric conversion elements of the solid-state image sensors.

In accordance with some embodiments of the present disclosure, a solid-state image sensor is provided. The solid-state image sensor includes a plurality of photoelectric conversion elements. The solid-state image sensor also includes a color filter layer disposed above the photoelectric conversion elements. The color filter layer has a plurality of color filter segments. The solid-state image sensor further includes a partition grid disposed between the color filter segments. Moreover, the solid-state image sensor includes a patterned structure disposed on the color filter layer. The patterned structure has a plurality of patterned segments. The solid-state image sensor also includes a transparent layer disposed on the color filter layer and the partition grid. The transparent layer surrounds the patterned segments. At least one patterned segment is disposed on the partition grid.

In some embodiments, the refractive index of the patterned structure is lower than the refractive index of the transparent layer.

In some embodiments, the refractive index of the patterned structure is between 1.2 and 1.65.

In some embodiments, the thickness of each patterned segment is less than or equal to the thickness of the transparent layer.

In some embodiments, one patterned segment is disposed on one color filter segment.

In some embodiments, at least tyro patterned segments are disposed on one color filter segment.

In some embodiments, in the cross-sectional view of the solid-state image sensor, the partition grid is divided into a plurality of partition grid segments, the distance between two partition grid segments that are arranged adjacent to each other defines a pixel size, and the ratio of the width of each patterned segment to the pixel size is less than 0.5.

In some embodiments, the solid-state image sensor farther includes a metal grid disposed between the color filter segments. The partition grid covers at least a portion of the metal grid.

In some embodiments, the solid-state image sensor further includes a plurality of condensing structures disposed on the transparent layer.

In some embodiments, the material of each condensing structure is the same as the material of the transparent layer.

In some embodiments, each condensing structure corresponds to one color filter segment.

In some embodiments, each condensing structure corresponds to at least two color filter segments.

In some embodiments, in the top view of the solid-state image sensor, the patterned segments form a plurality of patterned arrays.

In some embodiments, the patterned arrays correspond to two color filter segments that are arranged adjacent to each other.

In some embodiments, the patterned arrays correspond to two color filter segments that are diagonally arranged.

In some embodiments, each patterned array includes $x^2$ patterned segments, and x is a positive integer that is greater than or equal to 3.

In some embodiments, in the cross-sectional view of the solid-state image sensor, each patterned segment is formed as a triangle, a rectangle, a trapezoid, or a semicircle.

In some embodiments, each color filter segment corresponds to one photoelectric conversion element.

In some embodiments, each color filter segment corresponds to at least two photoelectric conversion elements.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1A:
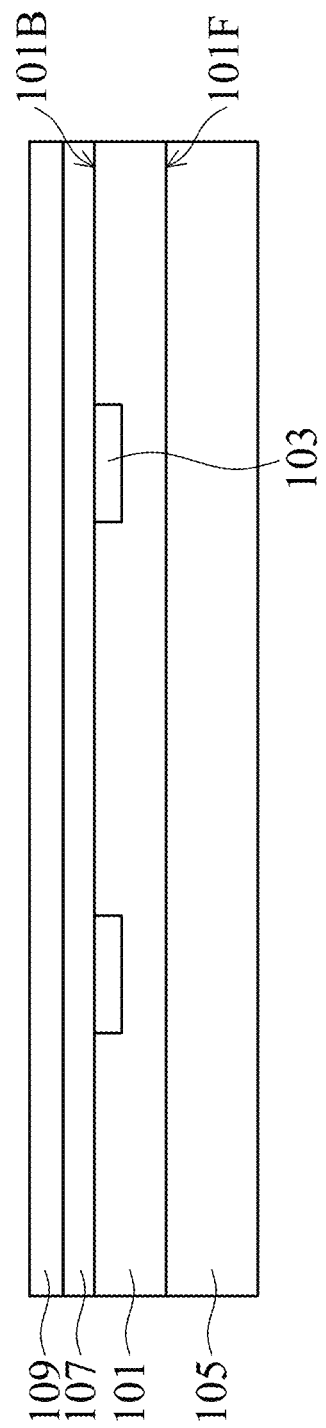
FIG. 1A to 1E are partial cross-sectional views illustrating the solid-state image sensor at various stages of manufacture in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean+/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and amity and does not in itself dictate a relationship between the various embodiments and/or configurations discussed.

Solid-state image sensors may be roughly classified into two groups in terms of the direction of light incident on a light receiving unit. One is the front-side illuminated (FSI) image sensors that receive light incident on the front side of a semiconductor substrate on which the wiring layer of the reading circuit is formed. Another is the back-side illuminated (BSI) image sensors that receive light incident on the back side of a semiconductor substrate on which no wiring layer is formed. For imaging a color image, color filter layers may be provided in the FSI and BSI image sensors. The FSI and BSI image sensors usually have a partition grid for separating the color filter layers to prevent color mixture.

FIG. 1A to 1E are partial cross-sectional views illustrating the solid-state image sensor 10 at various stages of manufacture in accordance with some embodiments of the present disclosure. It should be noted that some components of the solid-state image sensor 10 may be omitted in FIG. 1A to 1E for the sake of brevity.

Referring to FIG. 1A, a semiconductor substrate 101 which may be, for example, a wafer or a chip, is provided. The semiconductor substrate 101 has a front surface 101F and a back surface 101B opposite to the front surface 101F. A plurality of photoelectric conversion elements 103 such as photodiodes may be forced in the semiconductor substrate 101.

In some embodiments, the photoelectric conversion elements 103 in the semiconductor substrate 101 may be isolated from each other by isolation structures (not shown) such as shallow trench isolation (STI) regions or deep trench isolation (DTI) regions. The isolation structures may be formed in the semiconductor substrate 101 using etching process to form trenches and filling the trenches with an insulating or dielectric material.

As shown in FIG. 1A, in some embodiments, the photoelectric conversion elements 103 are formed on the back surface 101B of the semiconductor substrate 101 and a wiring layer 105 is formed on the front surface 101F of the semiconductor substrate 101, but the present disclosure is not limited thereto. The wiring layer 105 may be an interconnect structure that includes multiple conductive lines and vias embedded in multiple dielectric layers, and may further include various electric circuits required for the solid-state image sensor 10. Incident lights may radiate onto the side of the back surface 101B and be received by the photoelectric conversion elements 103.

As shown in FIG. 1A, in some embodiments, a high dielectric-constant (high-K) film 107 may be formed on the back surface 101B of the semiconductor substrate 101 and covering the photoelectric conversion elements 103. The material of the high-κ film 107 may include hafnium oxide ($HfO_2$), hafnium tantalum oxide (HfTaO), hafnium titanium oxide (HfTiO), hafnium zirconium oxide (HfZrO), tantalum pentoxide ($Ta_2O_5$), other suitable high-κ dielectric materials, or a combination thereof, but the present disclosure is not limited thereto. The high-κ film 107 may be formed by a deposition process. The deposition process is, far example, chemical vapor deposition (CVD), plasma enhanced chemical vapor deposition (PECVD), atomic layer deposition (ALD), or another deposition technique. The high-κ film 107 may have a high-refractive index and a light-absorbing ability.

As shown in FIG. 1A, in some embodiments, a buffer layer 109 may be formed on the high-κ film 107. The material of the buffer layer 109 may include silicon oxides, silicon nitrides, silicon oxynitrides, other suitable insulating materials, or a combination thereof, but the present disclosure is not limited thereto. The buffer layer 109 may be formed by a deposition process. The deposition process is, for example, spin-on coating, chemical vapor deposition, flowable chemical vapor deposition (FCVD), plasma enhanced chemical vapor deposition, physical vapor deposition (PVD), or another deposition technique.

Figure 1B:
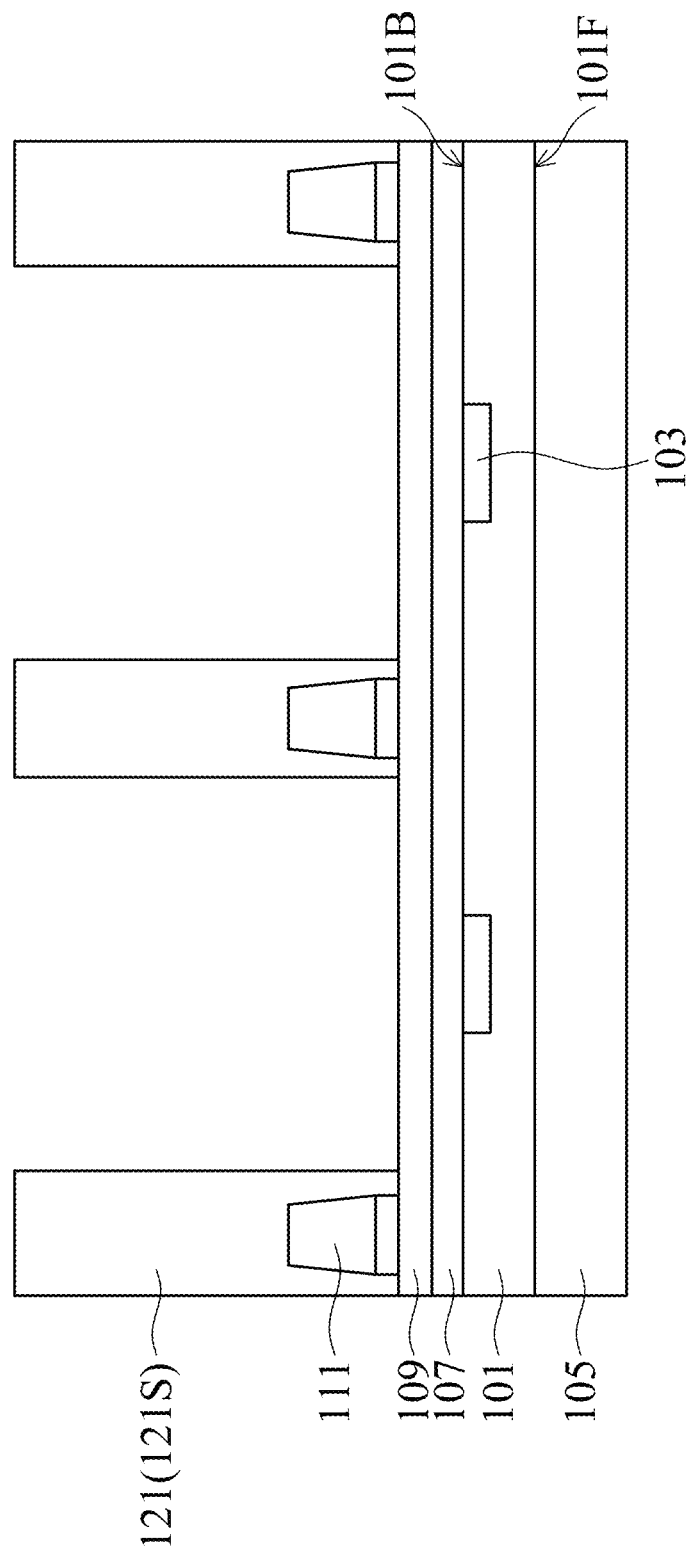

Referring to FIG. 1B, a metal grid 111 is formed on the semiconductor substrate 101. In particular, the metal grid 111 is formed on the buffer layer 109. In some embodiments, the material of the metal grid 111 may include tungsten (W), aluminum (Al), metal nitride (e.g., titanium nitride (TiN)), other suitable materials, or a combination thereof, but the present disclosure is not limited thereto. The metal grid 111 may be formed by depositing a metal layer on the buffer layer 109 and then patterning the metal layer using photolithography and etching processes to form the metal grid 111, but the present disclosure is not limited thereto.

Referring to FIG. 1B, a partition grid 121 is formed on the semiconductor substrate 101. In particular, the partition grid 121 is formed to correspond to the metal grid 111, so that the partition grid 121 may cover at least a portion of the metal grid 111. In some embodiments, the material of the partition grid 121 may include a transparent dielectric material that has a refractive index in a range from about 1.0 to about 1.99, but the present disclosure is not limited thereto. The partition grid 121 may be formed by depositing a transparent dielectric layer on the buffer layer 109 and then patterning the transparent dielectric layer using photolithography and etching processes to form the partition grid 121, but the present disclosure is not limited thereto.

Figure 1C:
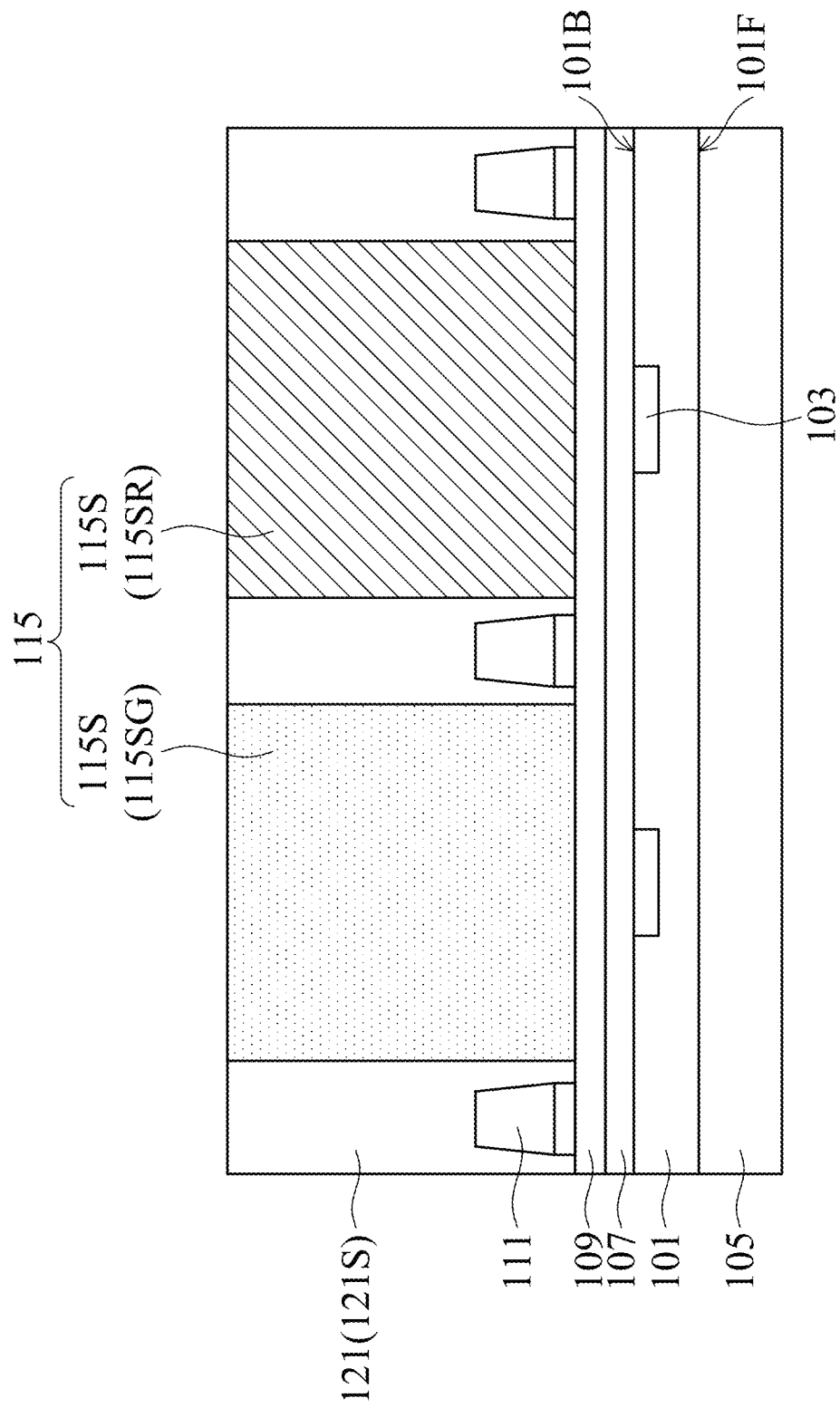

Referring to FIG. 1C, a color filter layer 115 is formed above the semiconductor substrate 101. In particular, the color filter layer 115 is formed above the photoelectric conversion elements 103 (i.e. the color filter layer 115 is formed to correspond to the photoelectric conversion elements 103). As shown in FIG. 1C, the color filter layer 115 may have a plurality of color filter segments 115S. The color filter segments 115S may correspond to the same color or different colors. For example, in FIG. 1C, one of the color filter segments 115 may be a red color filter segment (i.e., red color filter segment 115SR), and another of the color filter segments 115 may be a green color filter segment (i.e., green color filter segment 115SG), but the present disclosure is not limited thereto. In some other embodiments, the color filter segments 115S may include a blue color filter segment, a white color filter segment, and so on.

As shown in FIG. 1C, the metal grid 111 and the partition grid 121 are disposed between the color filter segments 115S. That is, the metal grid 111 and the partition grid 121 may be formed to separate the color filter segments 115S from each other, but the present disclosure is not limited thereto. In the embodiment shown in FIG. 1C, each color filter segment 115S corresponds to one photoelectric conversion element 103, but the present disclosure is not limited thereto. In some other embodiments, each color filter segment 115S may correspond to at least two photoelectric conversion elements 103 (e.g., four (2×2) photoelectric conversion elements 103).

Figure 1D:
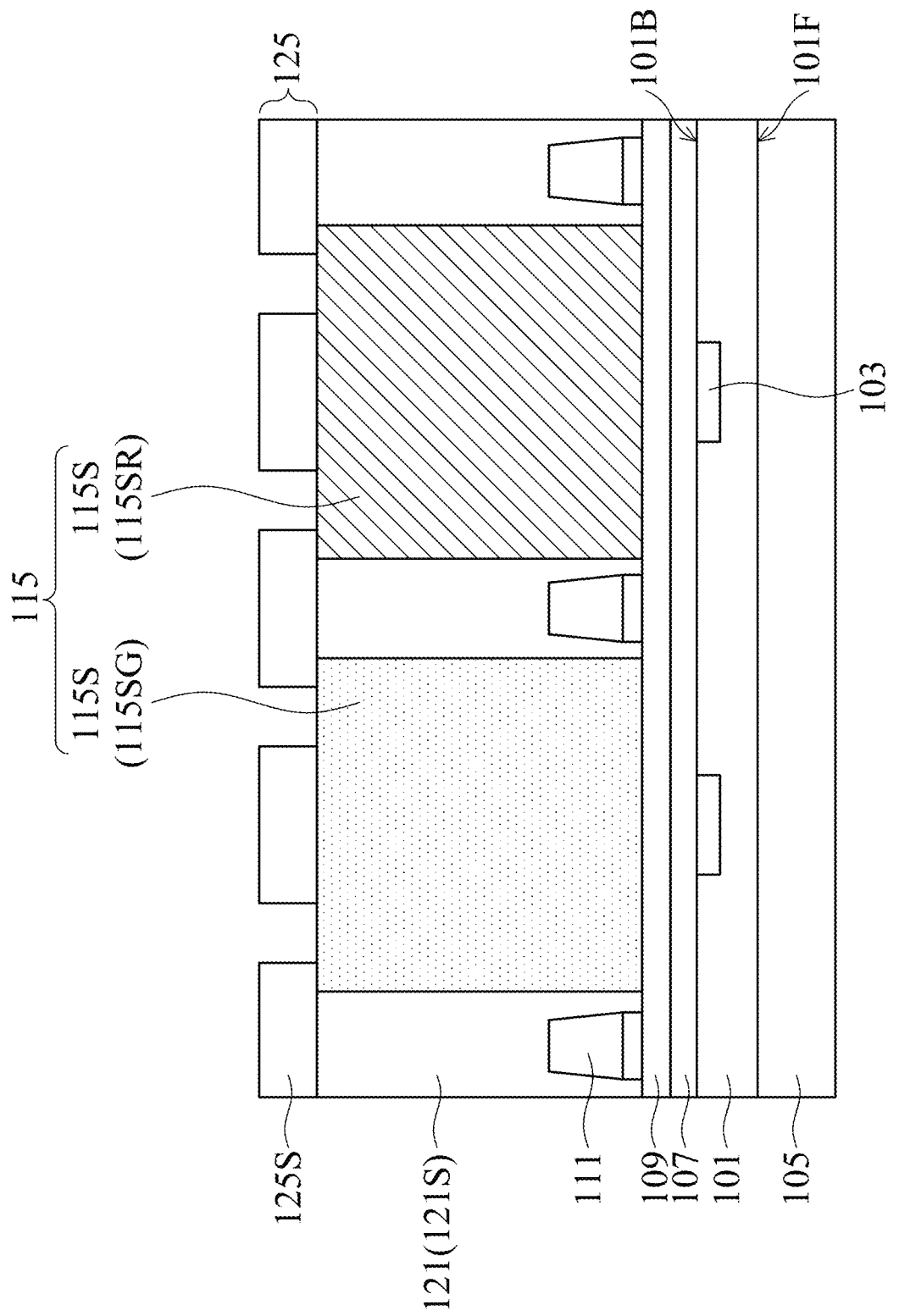

Referring to FIG. 1D, a patterned structure 125 is formed on the color filter layer 115. In particular, the patterned structure 125 is formed on both the color filter layer 115 and the partition grid 121, but the present disclosure is not limited thereto. In some embodiments, the material of the patterned structure 125 may be the same as or similar to the material of the partition grid 121. For example, the material of the patterned structure 125 may include a transparent dielectric material that has a refractive index in a range from about 1.0 to about 1.99, but the present disclosure is not limited thereto. The patterned structure 125 may be formed by depositing a transparent dielectric layer on the both the color filter layer 115 and the partition grid 121 and then patterning the transparent dielectric layer using photolithography and etching processes to form the patterned structure 125, but the present disclosure is not limited thereto.

As shown in FIG. 1D, the patterned structure 125 may have a plurality of patterned segments 125S. In the embodiments of the present disclosure, at least one of the patterned segments 125S is disposed on the partition grid 121. In the embodiment shown in FIG. 1D, some patterned segments 125S are disposed on the color filter segments 115 (including the red color filter segment 115SR and the green color filter segment 115SG), but the present disclosure is not limited thereto. In some other embodiment, no patterned segments are disposed on the color filter segments 115S.

Moreover, in the embodiment shown in FIG. 1D, one patterned segment 115S is disposed on one color filter segment 115S (e.g., the red color filter segment 115SR or the green color filter segment 115SG), but the present disclosure is not limited thereto. In some other embodiments, at least two (two or more) patterned segments 115S may be disposed on one color filter segment 115S.

Figure 1E:
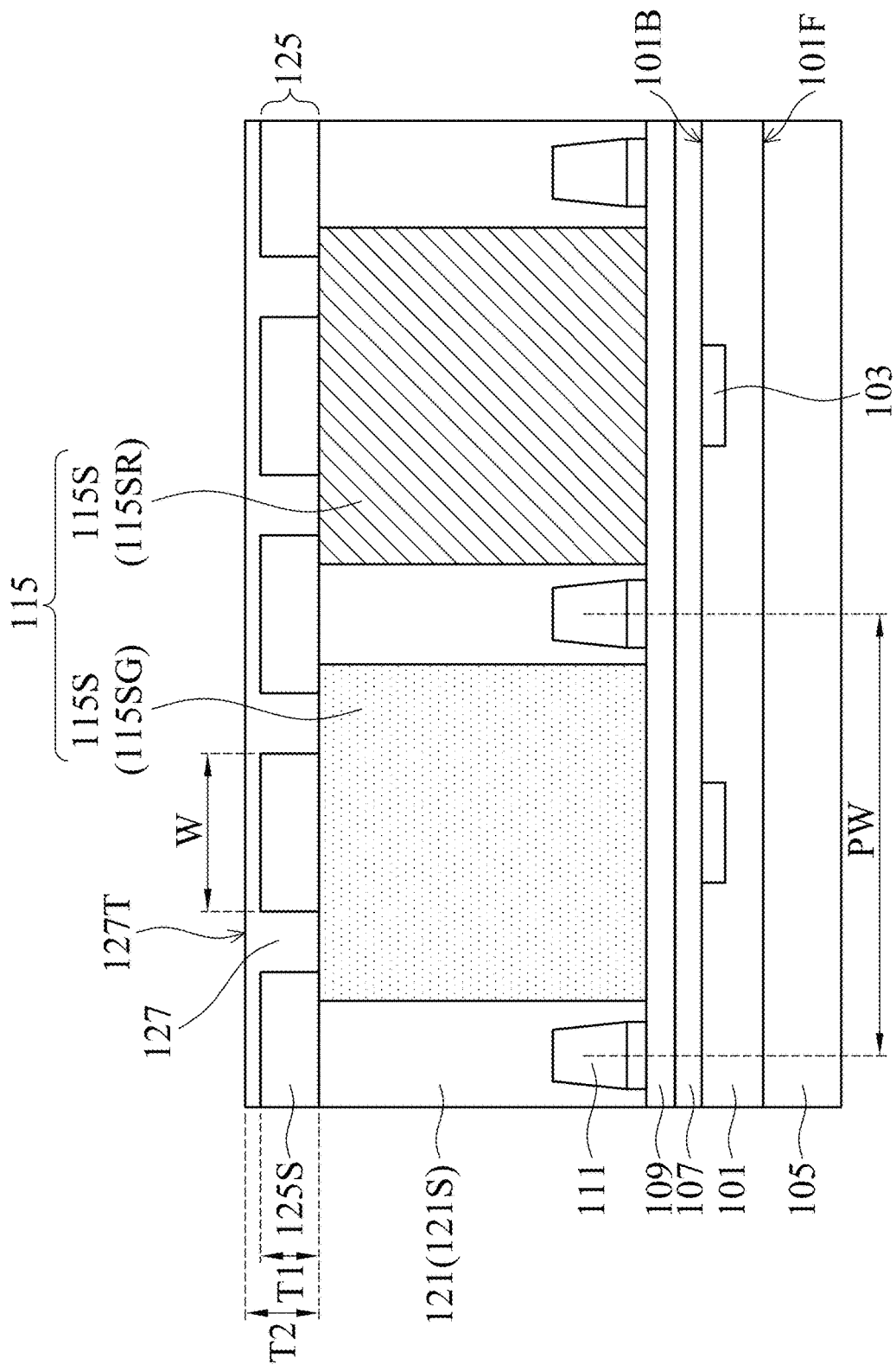

Referring to FIG. 1E, a transparent layer 127 is formed on the color filter layer 115 and the partition grid 121 to form the solid-state image sensor 10. In particular, as shown in FIG. 1E, the transparent layer 127 surrounds the patterned segments 125S. That is, the transparent layer 127 may fill the spaces between the patterned segments 125S. In some embodiments, the transparent layer 127 may be an organic layer, but the present disclosure is not limited thereto. In some embodiments, the material of the transparent layer 127 may include glass, epoxy resin, silicone resin, polyurethane, any other applicable material, or a combination thereof, but the present disclosure is not limited thereto. The transparent layer 127 may be formed by a deposition process. The examples of the deposition process are described above and will not be repeated here.

In the embodiments of the present disclosure, the refractive index of the patterned structure 125 is lower than the refractive index of the transparent layer 127. For example, the refractive index of the patterned structure 125 may be in a range from about 1.2 to about 1.65, but the present disclosure is not limited thereto.

In some embodiments, as shown in FIG. 1E, the thickness T1 of the patterned structure 125 (i.e., the thickness T1 of each patterned segment 125S) is less than or equal to the thickness T2 of the transparent layer 127. Moreover, the transparent layer 127 may have a substantially flat top surface 127T. That is, the transparent layer 127 may be referred to a flat layer for the patterned structure 125, but the present disclosure is not limited thereto.

In some embodiments, as shown in FIG. 1E, in the cross-sectional view of the solid-state image sensor 10, the partition grid 121 may be divided into a plurality of partition grid segments 121S. The distance between two adjacent partition grid segments 121S (the distance between the central axes of two adjacent partition grid segments 121S) defines a pixel size PW. Moreover, the patterned segments 125S may has the same width W. In some embodiments, the ratio of the width W of each patterned segment 125S to the pixel size PW may be less than 0.5.

In some embodiments, the solid-state image sensor 10 may be a complementary metal-oxide semiconductor (CMOS) image sensor or a charge coupled device (CCD) image sensor, but the present disclosures is not limited thereto.

The solid-state image sensor 10 as shower in FIG. 1E is referred to as a back-side illuminated (BSI) image sensor, but the present disclosure is not limited thereto. In some other embodiments, the solid-state image sensor may be a front-side illuminated (FSI) image sensor. The semiconductor substrate 101 and the wiring layer 105 shown in FIG. 1E may be inverted for FSI image sensor. In the FSI image sensor, incident lights radiate onto the side of the front surface 101E, pass through the wiring layer 105 and then are received by the photoelectric conversion elements 103 formed on the back surface 101B of the semiconductor substrate 101.

Figure 2:
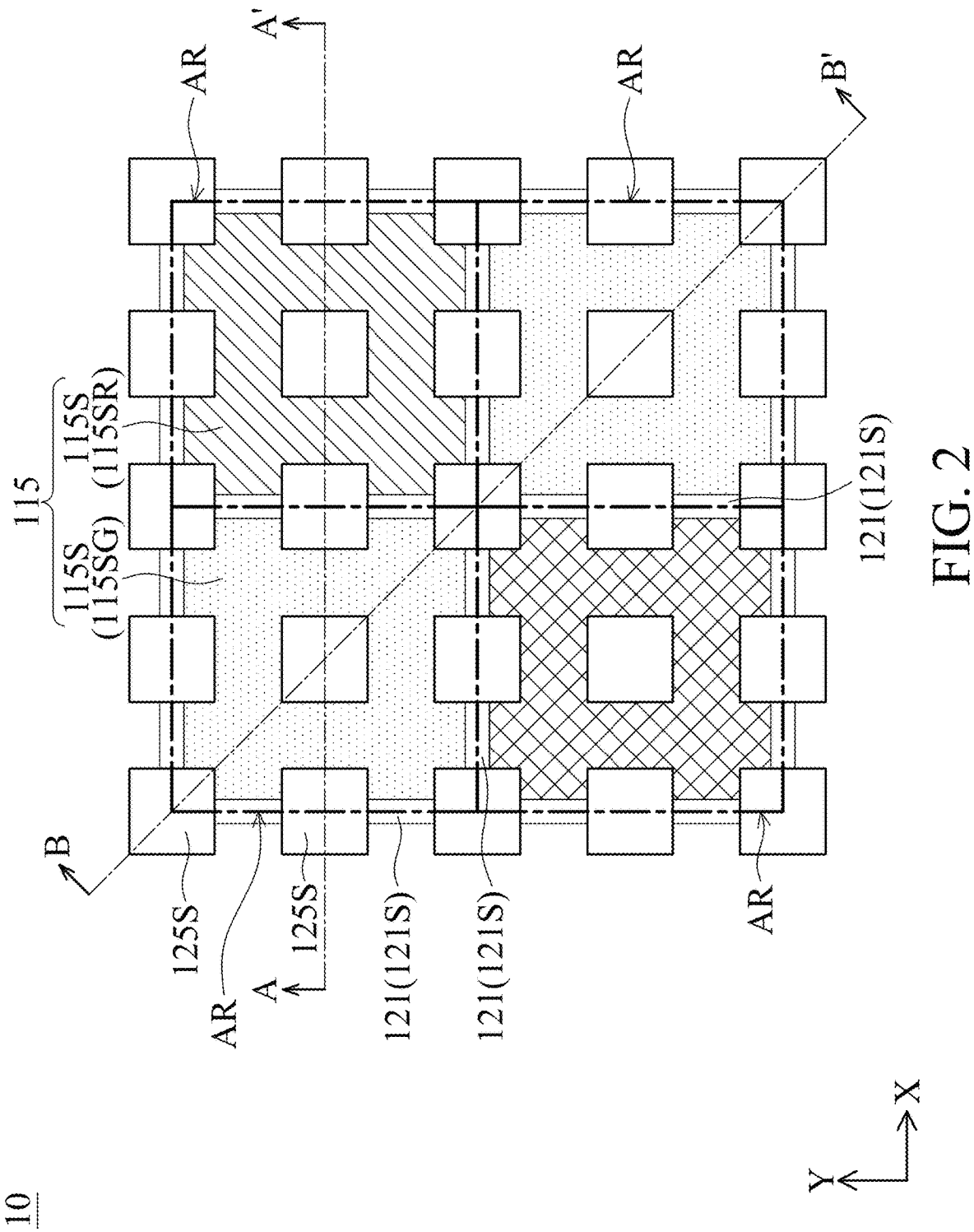
FIG. 2 is a partial top view illustrating, the solid-state image sensor according to one embodiment of the disclosure.

FIG. 2 is a partial top view illustrating the solid-state image sensor 10 according to one embodiment of the disclosure. For example. FIG. 1F may be a partial cross-sectional view of the solid-state image sensor 10 along line A-A' or line B-B' in FIG. 2. It should be noted that the transparent layer 127 is omitted in FIG. 2 for showing the patterned structure 125 (the patterned segments 125S) more clearly.

Referring FIG. 1E and FIG. 2, the solid-state image sensor 10 includes a plurality of photoelectric conversion elements 103. The solid-state image sensor 10 also includes a color filter layer 115 disposed above the photoelectric conversion elements 103. The color filter layer 115 has a plurality of color filter segments 115S. The solid-state image sensor 10 further includes a partition grid 121 disposed between the color filter segments 115S. Moreover, the solid-state image sensor 10 includes a patterned structure 125 disposed on the color filter layer 115. The patterned structure 125 has a plurality of patterned segments 125S. The solid-state image sensor 10 also includes a transparent layer 127 disposed on the color filter layer 115 and the partition grid 121. The transparent layer 127 surrounds the patterned segments 125S. At least one of the patterned segments 125S is disposed on the partition grid 121.

According to the embodiments of the present disclosure, the solid-state image sensor 10 includes a plurality of patterned segments 125S and the transparent layer 127 surrounds the patterned segments 125S, and the refractive index of the patterned segments 125S is lower than the refractive index of the transparent layer 127. It may prevent the partition grids 121 from generating diffraction, thereby improving the quality of the image signal from the photoelectric conversion elements 103 of the solid-state image sensors 10.

Figure 3:
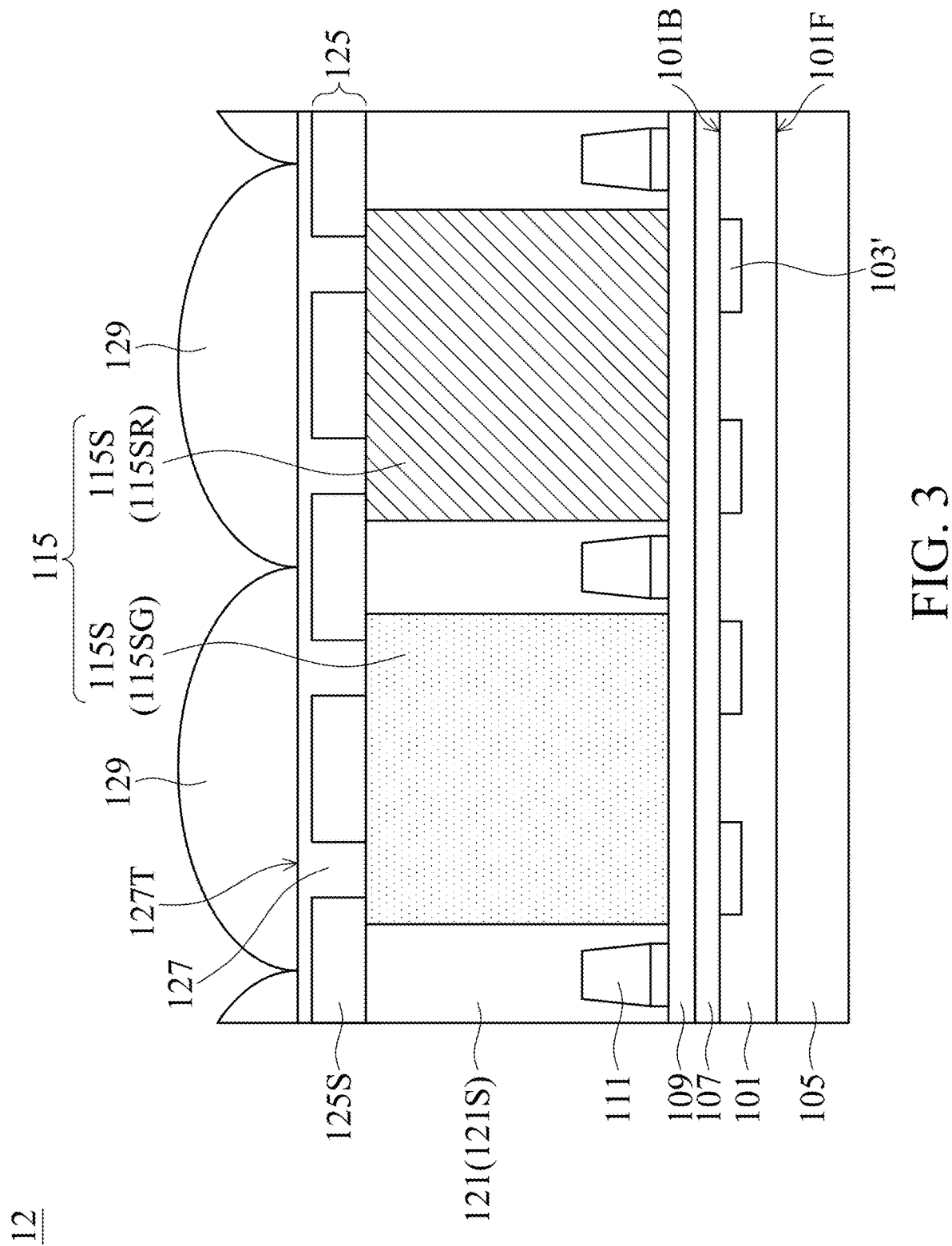
FIG. 3 is a cross-sectional view of a solid-state image sensor according to another embodiment of the disclosure.

FIG. 3 is a cross-sectional view of a solid-state image sensor 12 according to another embodiment of the disclosure. Similarly some components of the solid-state image sensor 12 may be omitted in FIG. 3 for the sake of brevity.

The solid-state image sensor 12 show in FIG. 3 has a similar structure to the solid-state image sensor 10 show in FIG. 1E. The difference from the solid-state image sensor 10 shown in FIG. 1E may include that the solid-state image sensor 12 show in FIG. 3 may further include a plurality of condensing structures 129 disposed on the transparent layer 127. In some embodiments, the condensing structures 129 may be used for condensing incident light. In some embodiments, the material of the condensing structure 129 may be the same as or similar to the material of the transparent layer 127. For example, the material of the condensing structure 129 may include glass, epoxy resin, silicone resin, polyurethane, any other applicable material, or a combination thereof, but the present disclosure is not limited thereto. In some embodiments, the condensing structure 129 may be formed by a photoresist reflow method, a hot embossing method, any other applicable method, or a combination thereof. In some embodiments, the steps of forming the condensing structure 129 may include a spin coating process, a lithography process, an etching process, any other applicable process, or a combination thereof, but the present disclosure is not limited thereto.

In some embodiment, the condensing structure 129 may be a micro-lens structure, such a semi-convex lens or a convex lens, but the present disclosure is not limited thereto. In some other embodiments, the condensing structure 129 may be micro-pyramid structures (e.g., circular cone, quadrangular pyramid, and so on), or may be micro-trapezoidal structures (e.g., flat top cone, truncated square pyramid, and so on). Alternatively, the condensing structure 129 may be a gradient-index structure.

In the embodiment shown in FIG. 3, each of the condensing structures 129 corresponds to one of the color filter segments 115S. For example, one condensing structure 129 corresponds to the red color filter segment 115SR, and another condensing structure 129 corresponds to the green color filter segment 115SG, but the present disclosure is not limited thereto. In some other embodiments, each condensing structure 129 may correspond to at least two color filter segments 115S.

The difference from the solid-state image sensor 10 shown in FIG. 1E may also include that each color filter segment 115S in FIG. 3 corresponds to at least two photoelectric conversion elements 103' (e.g., two (2×1) or four (2×2) photoelectric conversion elements 103'), but the present disclosure is not limited thereto. Similarly, in the embodiment shown in FIG. 3, each condensing structure 129 corresponds to at least two photoelectric conversion elements 103', but the present disclosure is not limited thereto. The number of photoelectric conversion element 103' to which each color filter segment 115S or each condensing structure 129 corresponds to may be adjusted depending on actual need.

Moreover, the partial top view of the solid-state image sensor 12 may also be similar to the partial top view of the solid-state image sensor 10 shown in FIG. 2. Referring to FIG. 2, in the top view of the solid-state image sensor 10, the patterned segments 125S may form a plurality of patterned arrays AR. As shown in FIG. 2, the pattered arrays AR may correspond to four color filter segments 115S that are arranged adjacent to each other along X-direction and Y-direction and each patterned array AR may include nine patterned segments 125S, but the present disclosure is not limited thereto.

FIG. 4A to 4E are partial top views illustrating the solid-state image sensor 14, the solid-state image sensor 16, the solid-state image sensor 18, the solid-state image sensor 20, and the solid-state image sensor 22 in accordance with different embodiments of the present disclosure.

Figure 4A:
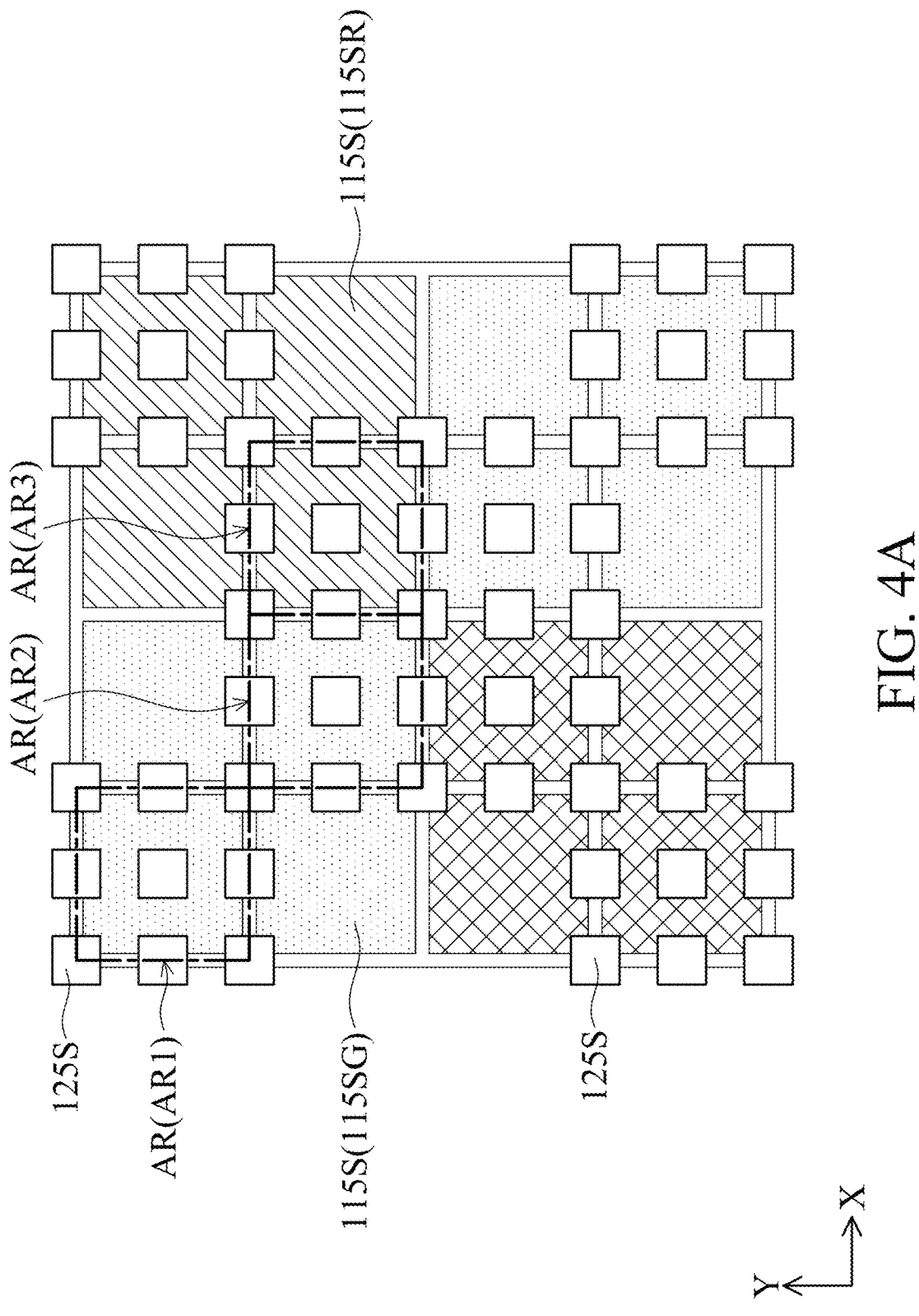
FIG. 4A to 4E are partial top views illustrating the solid-state image sensors in accordance with different embodiments of the present disclosure.

Referring to FIG. 4A, in the top view of the solid-state image sensor 14, the patterned segments 125S may form a plurality of patterned arrays AR. As shown in FIG. 4A, each patterned array AR may include nine patterned segments 125S, but the present disclosure is not limited thereto. Moreover, the patterned arrays AR may correspond to two color filter segments 115S that are arranged adjacent to each other along X-direction (e.g., the patterned arrays AR2 and the patterned arrays AR3), or two color filter segments 115S that are diagonally (e.g., the patterned arrays AR1 and the patterned arrays AR2).

Figure 4B:
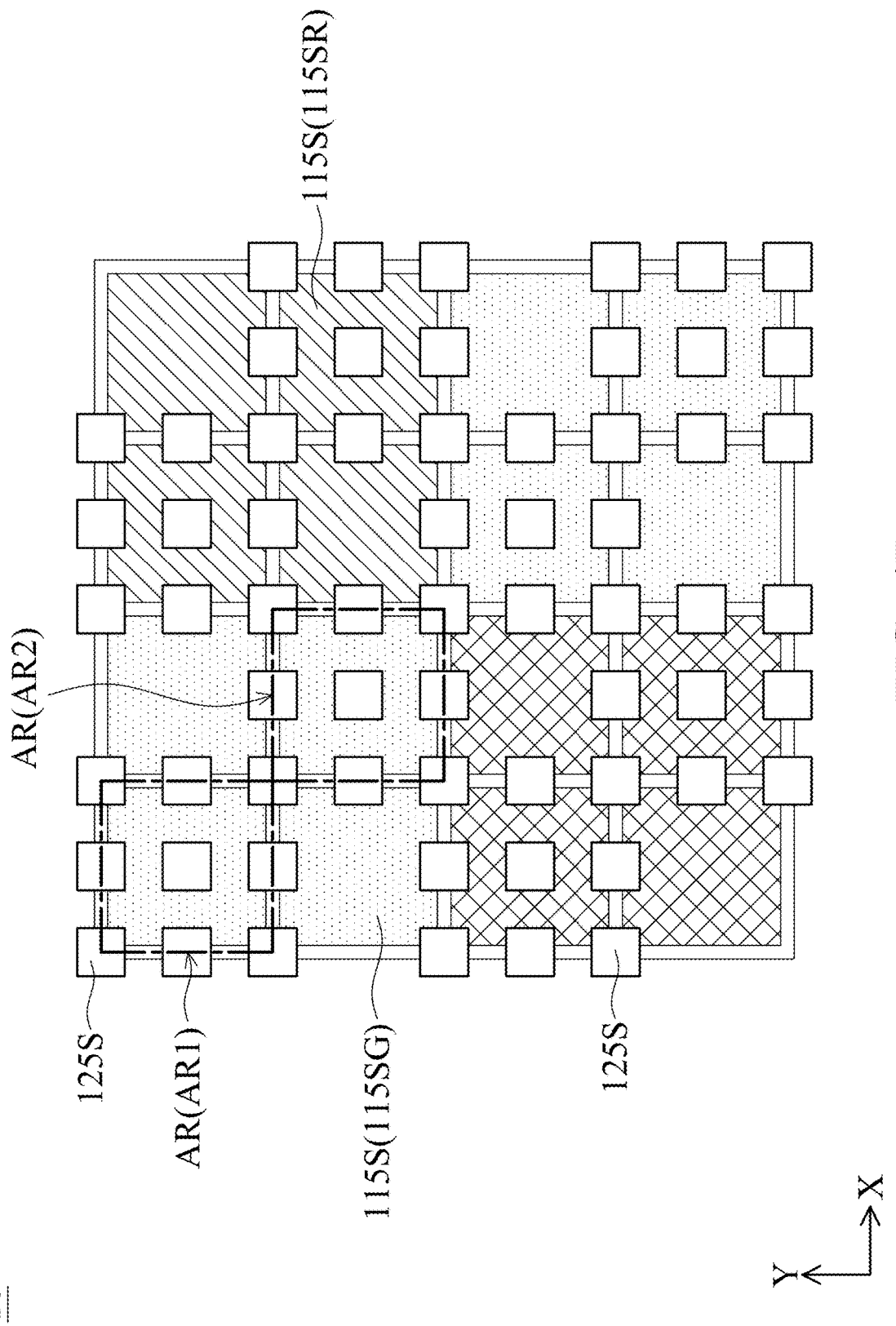

Referring to FIG. 4B, in the top view of the solid-state image sensor 16, the patterned segments 125S may form a plurality of patterned arrays AR. As shown in FIG. 4B, each patterned may AR may include nine patterned segments 125S, but the present disclosure is not limited thereto. Moreover, the patterned arrays AR may correspond to color filter segments 115S that are diagonally arranged (e.g., the patterned arrays AR1 and the patterned arrays AR2).

Figure 4C:
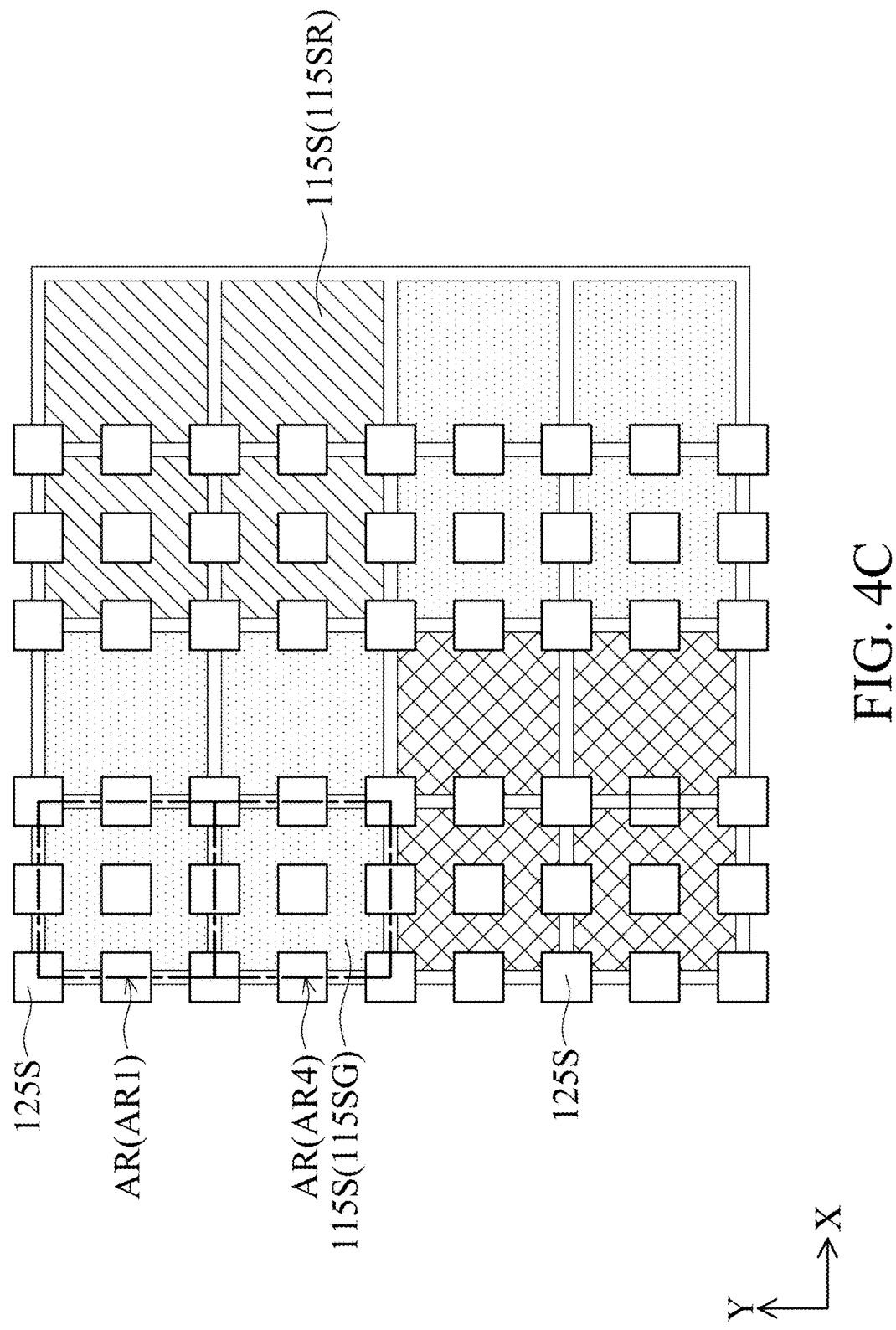

Referring to FIG. 4C, in the top view of the solid-state image sensor 18, the patterned segments 125S may form a plurality of patterned arrays AR. As shown in FIG. 4C, each patterned array AR may include nine patterned segments 125S, but the present disclosure is not limited thereto. Moreover, the patterned arrays AR may correspond to color filter segments 115S that are arranged adjacent to each other along Y-direction the patterned arrays AR1 and the patterned arrays AR4).

Figure 4D:
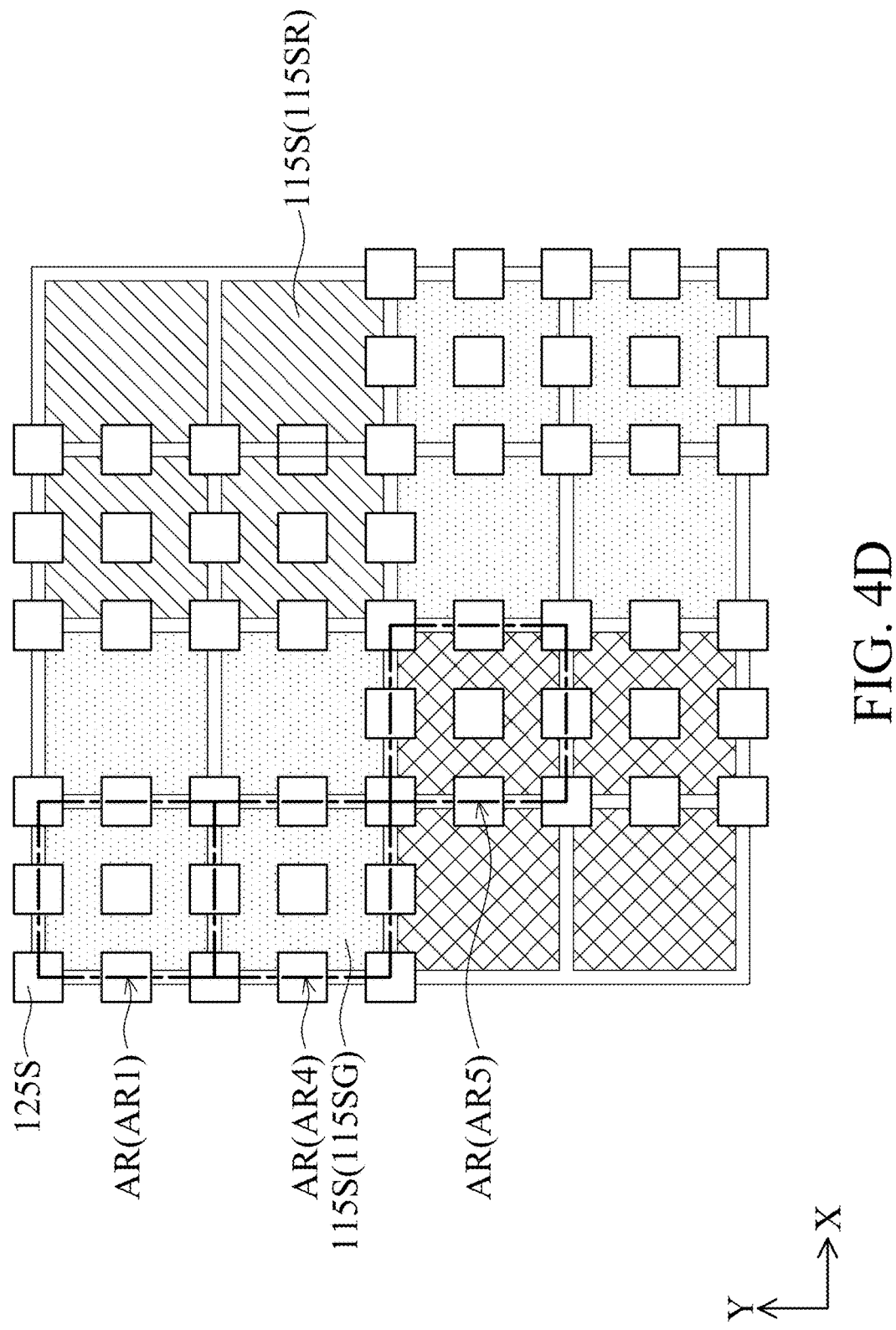

Referring to FIG. 4D, in the top view of the solid-state image sensor 20, the patterned segments 125S may form a plurality of patterned arrays AR. As shown in FIG. 4D, each patterned array AR may include nine patterned segments 125S, but the present disclosure is not limited thereto. Moreover, the patterned arrays AR may correspond to two color filter segments 115S that are arranged adjacent to each other along Y-direction (e.g., the patterned arrays AR1 and the patterned arrays AR4), or two color filter segments 115S that are diagonally arranged (e.g., the patterned arrays AR4 and the patterned arrays AR5).

Figure 4E:
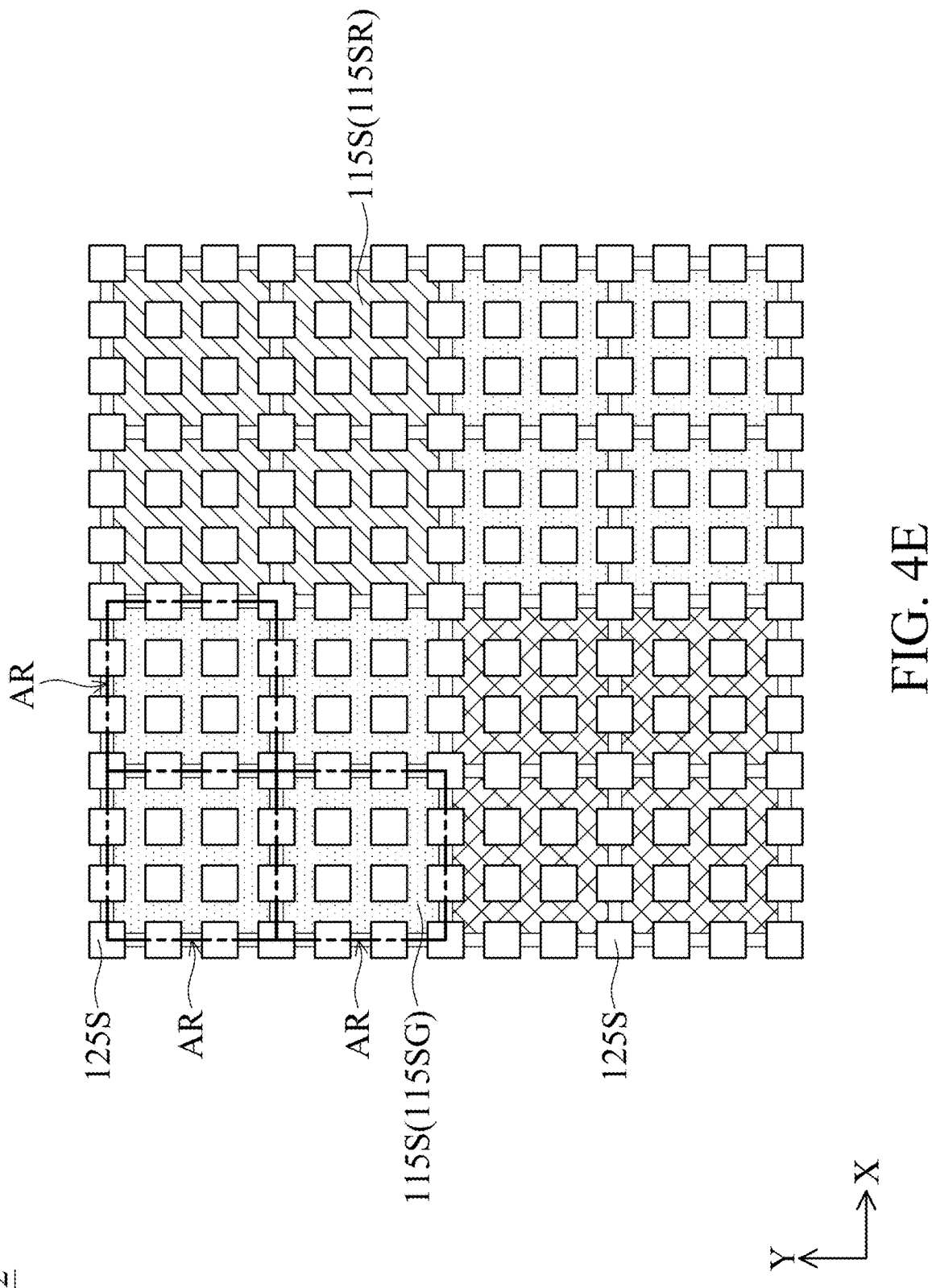

Referring to FIG. 4E, in the top view of the solid-state image sensor 22, the patterned segments 125S may form a plurality of patterned arrays AR. As shown in FIG. 4E, each patterned array AR may include sixteen patterned segments 125S, but the present disclosure is not limited thereto. Moreover, the patterned arrays AR may correspond the color filter segments 115S that are arranged adjacent to each other along X-direction and Y-direction.

The number of patterned segments 125S in each patterned array AR is not limited to the foregoing embodiments. In some embodiments, each patterned array AR may include $x^2$ patterned segments 125S, and x is a positive integer that is greater than or equal to 3, but the present disclosure is not limited thereto. Moreover, the number of patterned segments 125S in each patterned array AR may be variable (different from each other).

Furthermore, in the cross-sectional views of the solid-state image sensors of the foregoing embodiments, each patterned segments 125S is shown as a rectangle, but the present disclosure is not limited thereto.

Figure 5A:
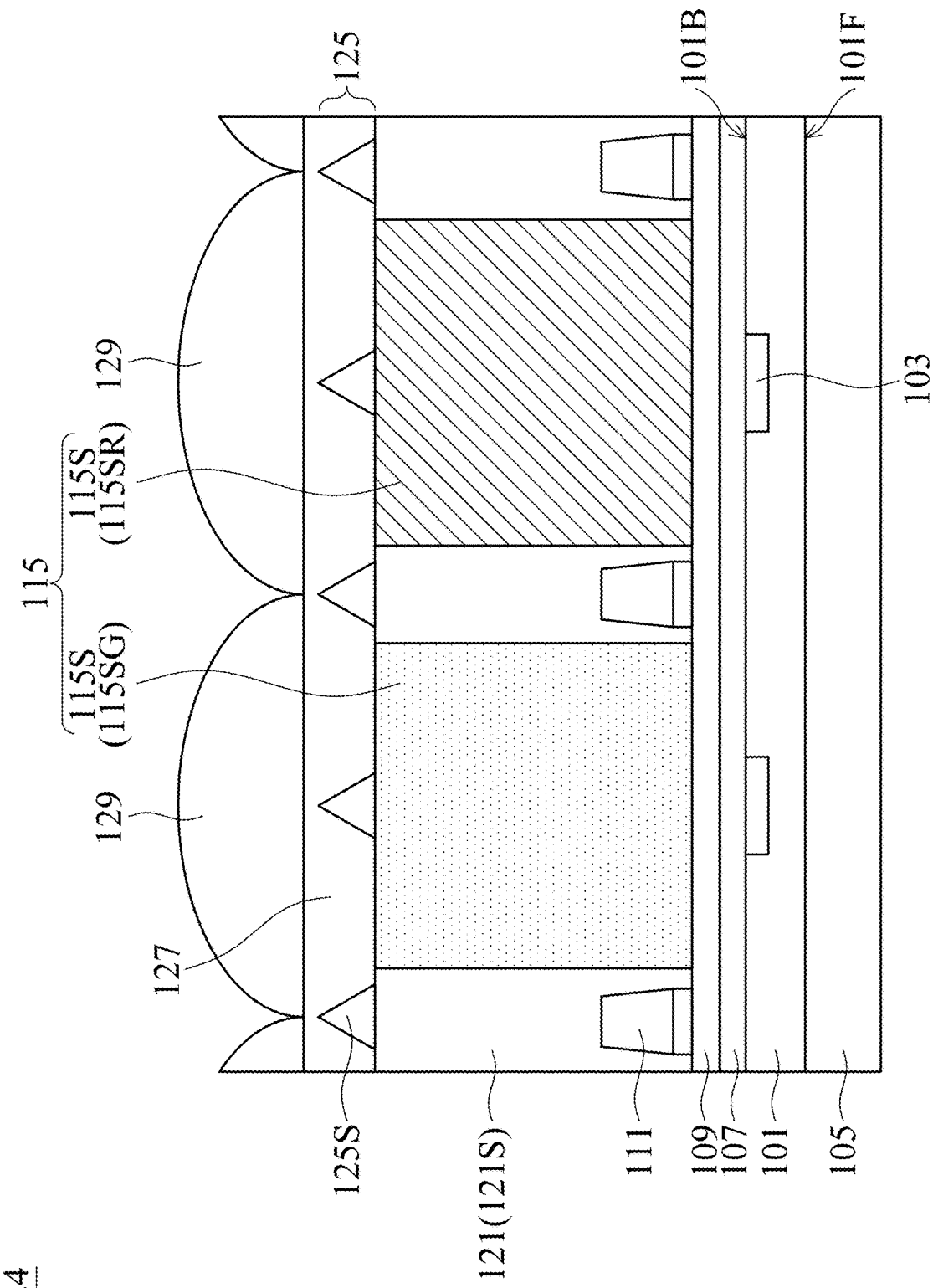
FIG. 5A to 5C are partial cross-sectional views illustrating the solid-state image sensors in accordance with different embodiments of the present disclosure.
Figure 5B:
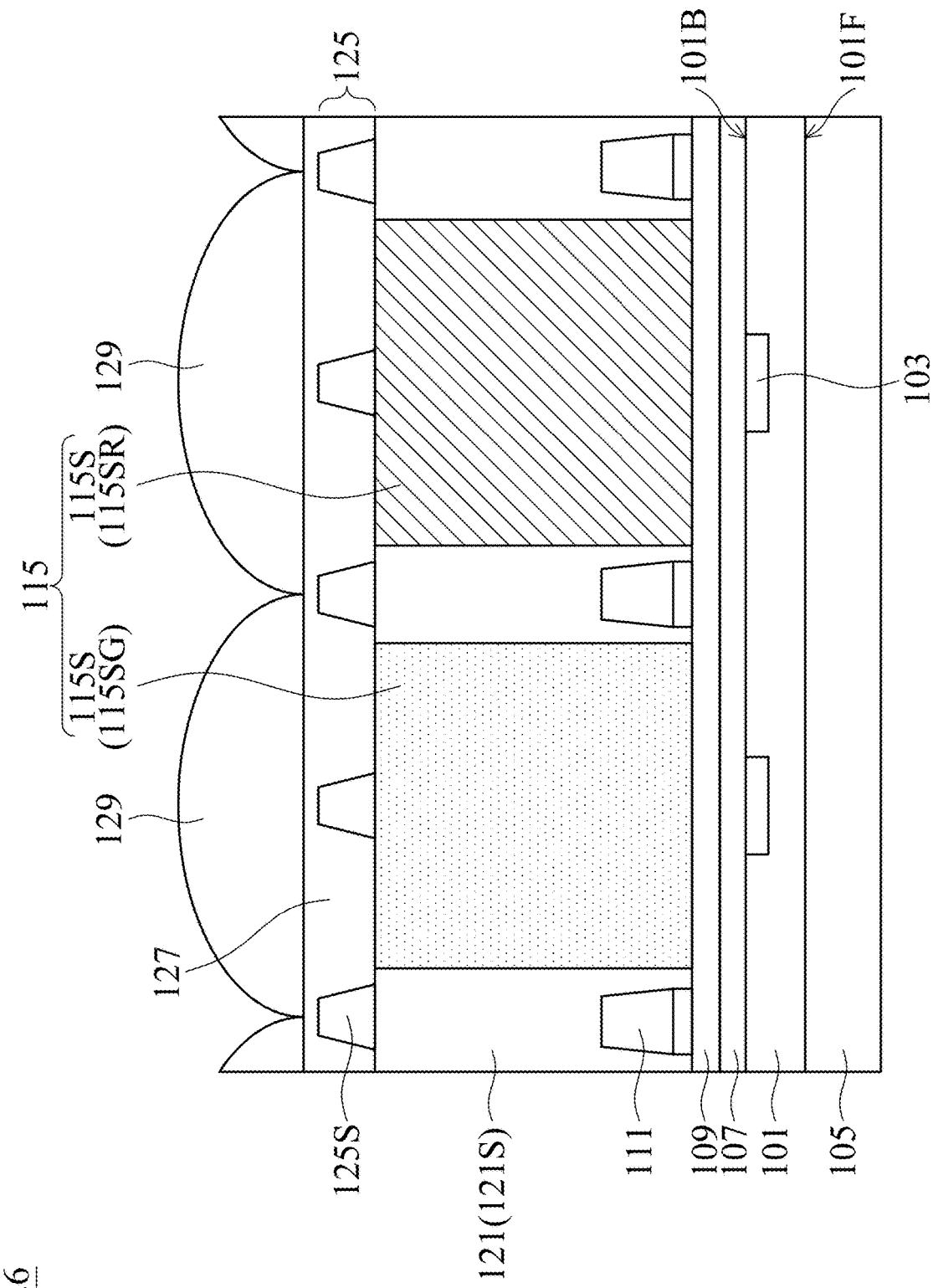
Figure 5C:
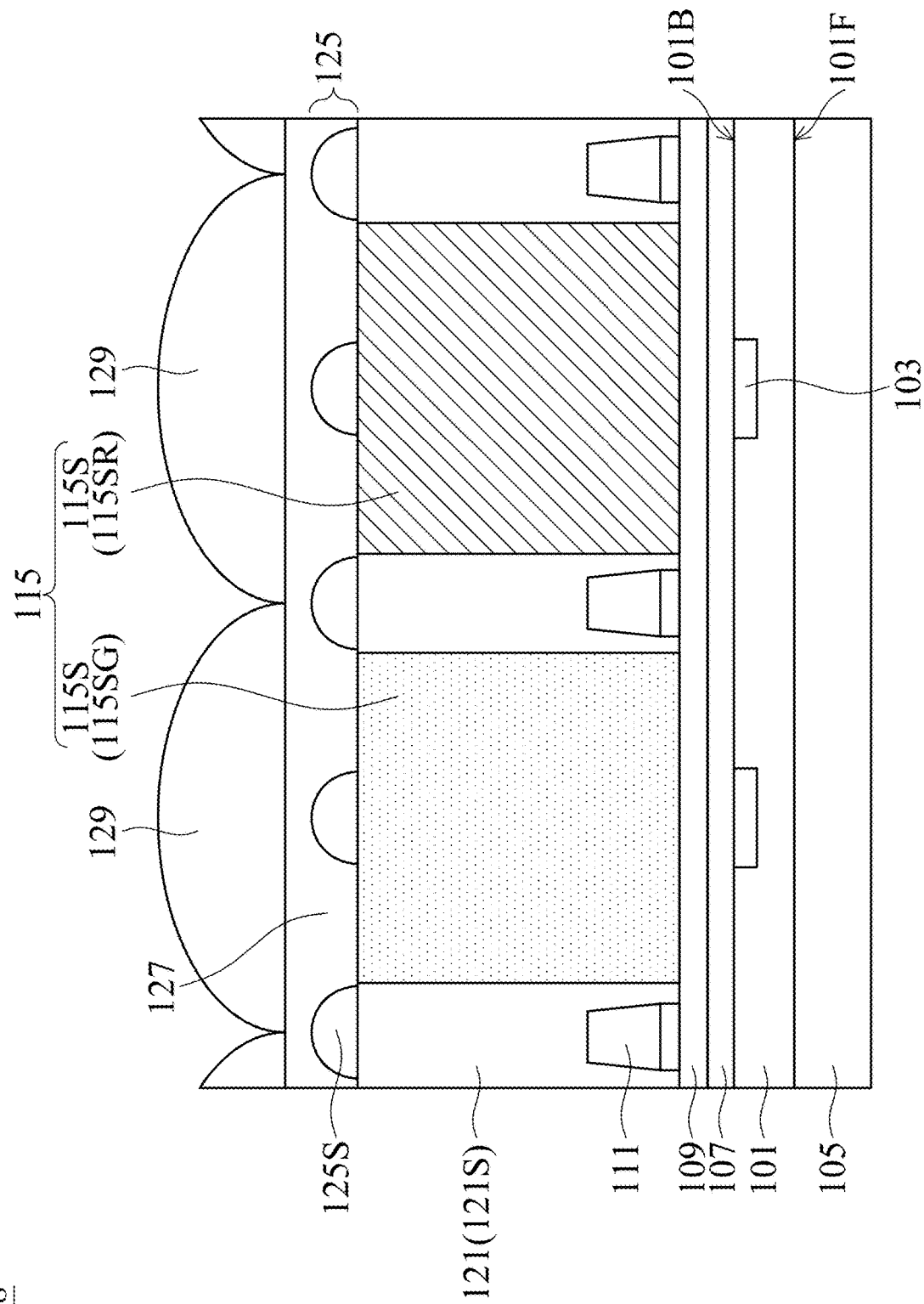

FIG. 5A to 5C are partial cross-sectional views illustrating the solid-state image sensor 24, the solid-state image sensor 26, and the solid-state image sensor 28 in accordance with different embodiments of the present disclosure.

Referring to FIG. 5A, in the cross-sectional view of the solid-state image sensor 24, each patterned segment 125S is formed as a triangle. Referring to FIG. 5B, in the cross-sectional view of the solid-state image sensor 26, each patterned segment 125S is formed as a trapezoid. Referring to FIG. 5C, in the cross-sectional view of the solid-state image sensor 28, each patterned segment 125S is formed as a semicircle. The shape of each patterned segment 125S in the cross-sectional view of the solid-state image sensor is not limited to the foregoing embodiments, which may be changed depending on actual need.

Moreover, in the embodiments shown in FIG. 5A to 5C, each color filter segment 115S (e.g., green color filter segment 115SG or red color filter segment 115SR) or each condensing structure 129 may correspond to one photoelectric conversion element 103, but the present disclosure is not limited thereto.

In summary, according to the embodiments of the present disclosure, the solid-state image sensor includes a plurality of patterned segments and a transparent layer that surrounds the patterned segments, and the refractive index of the patterned segments is lower than the refractive index of the transparent layer. It may prevent the partition grids from generating diffraction, thereby improving the quality of the image signal from the photoelectric conversion elements of the solid-state image sensors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features advantages, and characteristics of the disclosure may be combined in any suitable manner in one or more embodiments. One skilled in the relevant art will recognize, in hot of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A solid-state image sensor, comprising:
   a plurality of photoelectric conversion elements;
   a color filter layer disposed above the photoelectric conversion elements, and having a plurality of color filter segments;
   a partition grid disposed between the plurality of color filter segments;
   a patterned structure disposed on the color filter layer and having a plurality of patterned segments; and
   a transparent layer disposed on the color filter layer and the partition grid and surrounding the plurality of patterned segments,
   wherein at least one of the plurality of patterned segments is disposed on the partition grid.

2. The solid-state image sensor as claimed in claim 1, wherein a refractive index of the patterned structure is lower than a refractive index of the transparent layer.

3. The solid-state image sensor as claimed in claim 2, wherein the refractive index of the patterned structure is between 1.2 and 1.65.

4. The solid-state image sensor as claimed in claim 1, wherein a thickness of each of the plurality of patterned segments is less than or equal to a thickness of the transparent layer.

5. The solid-state image sensor as claimed in claim 1, wherein one of the plurality of patterned segments is disposed on one of the plurality of color filter segments.

6. The solid-state image sensor as claimed in claim 1, wherein at least two of the plurality of patterned segments are disposed on one of the plurality of color filter segments.

7. The solid-state image sensor as claimed in claim 1, wherein in a cross-sectional view of the solid-state image sensor, the partition grid is divided into a plurality of partition grid segments, a distance between two of the plurality of partition grid segments that are arranged adjacent to each other defines a pixel size, and a ratio of a width of each of the plurality of patterned segments to the pixel size is less than 0.5.

8. The solid-state image sensor as claimed in claim 1, further comprising:
a metal grid disposed between the plurality of color filter segments,
wherein the partition grid covers at least a portion of the metal grid.

9. The solid-state image sensor as claimed in claim 1, further comprising:
a plurality of condensing structures disposed on the transparent layer.

10. The solid-state image sensor as claimed in claim 9, wherein a material of each of the plurality of condensing structures is the same as a material of the transparent layer.

11. The solid-state image sensor as claimed in claim 9, wherein each of the plurality of condensing structures corresponds to one of the plurality of color filter segments.

12. The solid-state image sensor as claimed in claim 9, wherein each of the plurality of condensing structures corresponds to at least two of the plurality of color filter segments.

13. The solid-state image sensor as claimed in claim 1, wherein in a top view of the solid-state image sensor, the plurality of patterned segments form a plurality of patterned arrays.

14. The solid-state image sensor as claimed in claim 13, wherein the plurality of patterned arrays correspond to two of the plurality of color filter segments that are arranged adjacent to each other.

15. The solid-state image sensor as claimed in claim 13, wherein the plurality of patterned arrays correspond to two of the plurality of color filter segments that are diagonally arranged.

16. The solid-state image sensor as claimed in claim 13, wherein each of the plurality of patterned arrays includes $x^2$ of the plurality of patterned segments, and x is a positive integer that is greater than or equal to 3.

17. The solid-state image sensor as claimed in claim 1, wherein in a cross-sectional view of the solid-state image sensor, each of the plurality of patterned segments is formed as a triangle, a trapezoid, or a semicircle.

18. The solid-state image sensor as claimed in claim 1, wherein each of the plurality of color filter segments corresponds to one of the plurality of photoelectric conversion elements.

19. The solid-state image sensor as claimed in claim 1, wherein each of the plurality of color filter segments corresponds to at least two of the plurality of photoelectric conversion elements.

* * * * *